US006977968B1

(12) United States Patent  (10) Patent No.: US 6,977,968 B1
Lipp  (45) Date of Patent: Dec. 20, 2005

(54) TRANSMITTING-RECEIVING DEVICE COMPRISING A CLOSED CARTESIAN FEEDBACK LOOP

(75) Inventor: Friedrich Lipp, Austria (AT)

(73) Assignee: Rohde & Schwarz GmbH & Co. KG, Munich (DE)

(*) Notice: Subject to any disclaimer, the term of this patent is extended or adjusted under 35 U.S.C. 154(b) by 764 days.

(21) Appl. No.: 10/089,031

(22) PCT Filed: Jun. 28, 2000

(86) PCT No.: PCT/EP00/06030

§ 371 (c)(1), (2), (4) Date: Mar. 26, 2002

(87) PCT Pub. No.: WO01/24472

PCT Pub. Date: Apr. 5, 2001

(30) Foreign Application Priority Data

Sep. 29, 1999  (DE)  ................................ 199 46 668

(51) Int. Cl.[7] .................. H04L 25/03; H04L 27/20; H03F 3/45
(52) U.S. Cl. .................. 375/297; 330/254; 332/103
(58) Field of Search ............................ 375/296, 297, 375/295, 219, 316; 330/250, 252, 254; 332/103; 329/304; 455/91, 126

(56) References Cited

U.S. PATENT DOCUMENTS 5,613,226 A * 3/1997 Kanami ................ 455/115.1
5,623,226 A * 4/1997 Whitmarsh et al. ............ 330/2
5,793,817 A    8/1998 Wilson
5,832,022 A * 11/1998 Scott ........................ 375/142
5,894,496 A    4/1999 Jones
6,081,698 A * 6/2000 Moriyama et al. .......... 455/126

FOREIGN PATENT DOCUMENTS

| EP | 0 706 259 A1 | 4/1996 |
| WO | WO 98/00908 A1 | 1/1998 |
| WO | WO 99/04486 A1 | 1/1999 |
| WO | WO 99/17439 A1 | 4/1999 |
| WO | WO 00/25421 A1 | 5/2000 |

* cited by examiner

Primary Examiner—Tesfaldet Bocure
Assistant Examiner—Vineeta Panwalkar
(74) Attorney, Agent, or Firm—Caesar, Rivise, Bernstein, Cohen & Pokotilow, Ltd.

(57) ABSTRACT

The invention relates to a transmitting device (19) including a quadrature modulator (3) for carrying out the quadrature modulation of a complex input signal (I, Q) and including a power amplifier (9) connected in outgoing circuit to the quadrature modulator (3). A quadrature demodulator (19) for carrying out the quadrature demodulation of the output signal of the power amplifier (9) is provided for a feedback loop. A first differential amplifier (26) and a second differential amplifier (27) are connected in incoming circuit to the quadrature modulator (3). The input signal and the fed back quadrature modulated signal are supplied to the inputs of the differential amplifiers. When switching over from the transmit mode to a transmit-interruption mode, the output of the first and second differential amplifiers (26, 27) can be directly connected to the compensation input (−) of the first or second differential amplifier (26, 27) via a direct signal path (32, 33) while bypassing the quadrature modulator (3), the power amplifier (8) and the quadrature modulator (19).

22 Claims, 3 Drawing Sheets

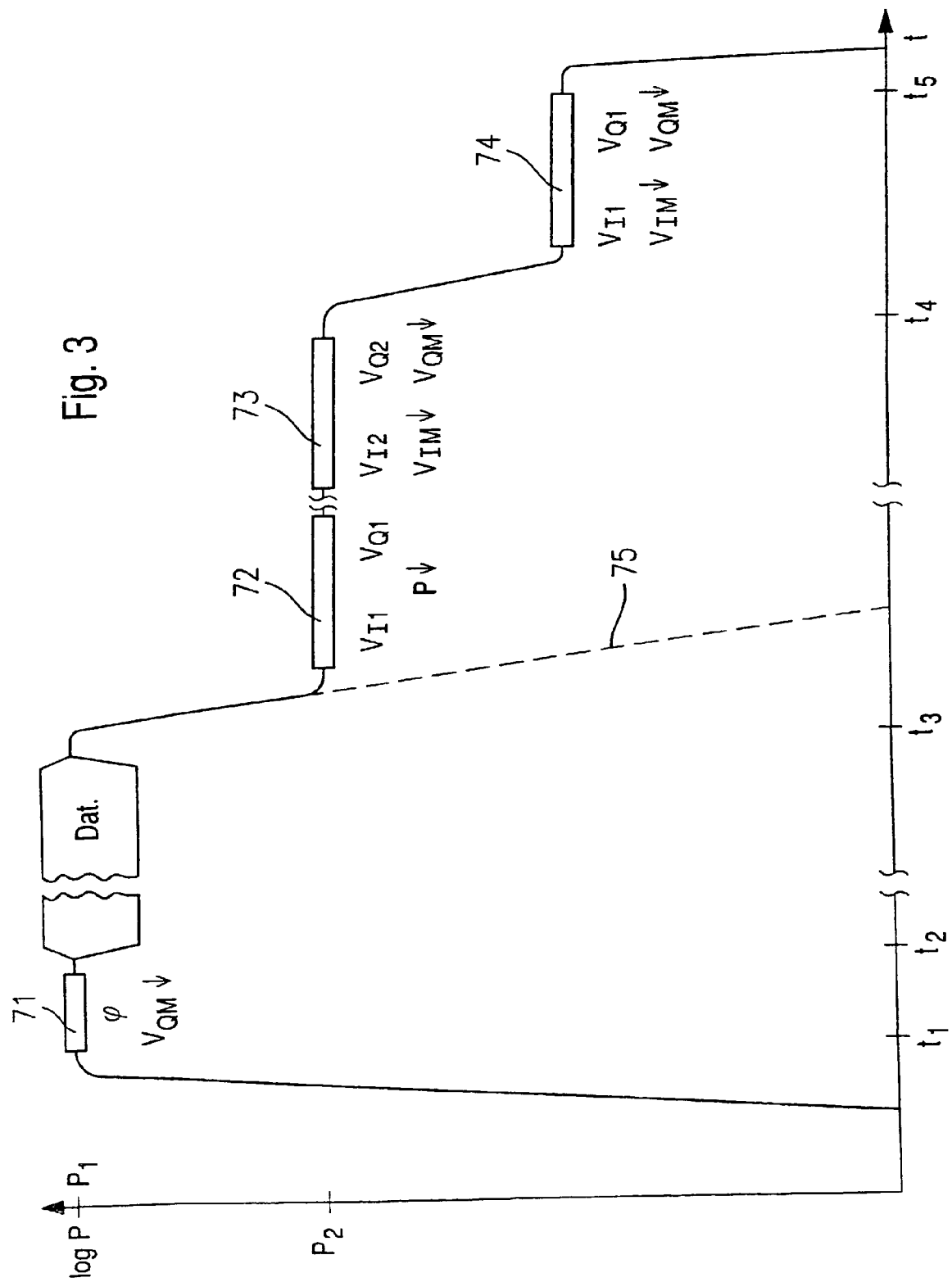

TRANSMITTING-RECEIVING DEVICE COMPRISING A CLOSED CARTESIAN FEEDBACK LOOP

BACKGROUND OF THE INVENTION

The invention relates to a transmitter with a quadrature modulator and a power amplifier, which is linearised by what is known as a Cartesian feedback with a quadrature modulator.

EP 0 706 259 A1 discloses a transmitter in which a baseband input signal is applied via two differential amplifiers to a quadrature modulator, which effects a quadrature modulation of the in-phase component and the quadrature-phase component of the complex input signal. The signal is applied to an up-converter, which brings the signal from the baseband up to the transmission frequency. Power amplification takes place in a downstream power amplifier. A feedback loop is provided in order to compensate for the non-linearity of this power amplifier, generally known as a Cartesian feedback. Located in this feedback loop, firstly, is a down-converter which converts the transmission signal uncoupled from the output of the power amplifier back down to the baseband. Located in the baseband is a quadrature demodulator, which separates the feedback signal into a feedback in-phase component and a feedback quadrature-phase component. The feedback in-phase component together with the in-phase component of the input signal is forwarded to a first differential amplifier connected upstream of the quadrature modulator. Likewise, the feedback quadrature-phase component together with the quadrature-phase component of the input signal is applied to a second differential amplifier. The non-linearities of the power amplifier are compensated through the feedback signal as a result.

In order to compensate the DC components of the quadrature modulator, document EP 0 706 259 A1 proposes operating a training sequence during which no input signal is applied to the transmitter. The output signal of the two differential amplifiers is integrated in a respective integrator and applied to a respective sample and hold circuit connected downstream of the integrator. During the training sequence, the sample and hold circuit is in the sampling state and applies a compensation signal to a negative feedback input of the co-operating differential amplifier such that the direct voltage components of the associated arm of the quadrature modulator are compensated. During normal transmission mode, the sample and hold circuit is in the hold state and applies the compensation level determined during the training run to the input of the respective differential amplifier. Document EP 0 706 259 A1 also proposes running another training sequence, during which switches provided on the output of the quadrature modulator are opened, to determine the phase shift for a phase shifter provided between a local oscillator and the quadrature modulator by detecting the output signal of the quadrature modulator in this state with two different input signals.

When using a transmitter which operates on the principle of Cartesian feedback in aeronautical radio communications, particularly with digital aeronautical radio communications operating in TDMA-simplex in accordance with the VDL standard (VHF digital link), a problem arises in that it is very difficult to switch rapidly between transmission mode and reception mode because on switching from transmission mode to reception mode the power amplifier and the local oscillator have to be completely disabled in order to prevent radiation in the receiver. However, the high-frequency feedback loop between the outputs and the compensation inputs of the differential amplifiers necessarily has to be broken in the process. When the power amplifier and the local oscillator are re-enabled as the operating mode is switched from reception to transmission, the feedback loop therefore has to be re-built, which leads to undesirable signal jumps during the switch from reception to transmission. Whilst transmission is interrupted, control of the feedback loop would be adjusted to the positive or negative control end. When re-enabled, the full transmission power would immediately be applied. Document EP 0 706 259 A1 does not suggest any means by which this problem can be eliminated.

SUMMARY OF THE INVENTION

Accordingly, the underlying objective of the invention is to propose a transmitter with a power amplifier, linearised on the principle of Cartesian feedback, which enables rapid switching from transmission to reception mode, and to specify a corresponding method for switching this transmitter from transmission mode into a transmission-interrupt mode or reception mode.

In terms of the transmitter, this objective is achieved by the characterising features of claim 1 and in terms of the method by the characterising features of claim 10 respectively, in conjunction with the known generic features.

The invention is based on the principle whereby, connected in parallel with the high-frequency signal path formed by the quadrature modulator, the power amplifier and the quadrature demodulator is another direct signal path, via which the output of the differential amplifier is connected to the feedback input when switching from transmission mode to reception mode, bypassing the quadrature modulator, the power amplifier and the quadrature demodulator. The output of the differential amplifier is therefore connected to its feedback input at all times—during transmission mode via the high-frequency signal path and during reception mode via the direct (DC) signal path. The switch from reception to transmission is preferably operated so that when switching from transmission mode to reception mode, the direct (DC) signal path is closed first of all, before the high-frequency signal path is opened. On switching from transmission mode into reception mode, the sequence is reversed accordingly. This avoids signal jumps when switching from transmission to reception.

Advantageously, two additional differential amplifiers are provided respectively in both the in-phase signal path and the quadrature-phase signal path, by means of which compensating voltages can be coupled into the signal paths in order to compensate both the DC offset of the quadrature modulator and the DC offset of the quadrature demodulator. As a result, in the disabled state when no signal is present on the I and Q input, the voltage value OV is obtained at the input and output of the differential amplifier enabling the DC signal path to be activated surge-free.

The quadrature modulator is compensated when the high-frequency signal path is closed. The quadrature demodulator, on the other hand, is compensated with the high-frequency signal path open and the DC signal path closed. Compensation is operated in such a way that the output voltage at the differential amplifiers used for compensation purposes is minimised. This can be accomplished with very little complexity in terms of measurement and at a high measuring rate. In addition, the quadrature demodulator can be trimmed whilst the high-frequency signal path is still closed, in which case the output power of the power amplifier when the input signal is disabled is used as the measured value, i.e. can be measured by means of a logarithmic detector.

A simplified example of an embodiment of the invention will be described in more detail below with reference to the drawings. Of the drawings:

BRIEF DESCRIPTION OF SEVERAL VIEWS OF THE DRAWINGS

FIG. 3 is a schematic diagram of the output power of the transmitter as a function of time with a view to explaining a preferred compensating method.

DETAILED DESCRIPTION OF THE INVENTION

Figure 1:
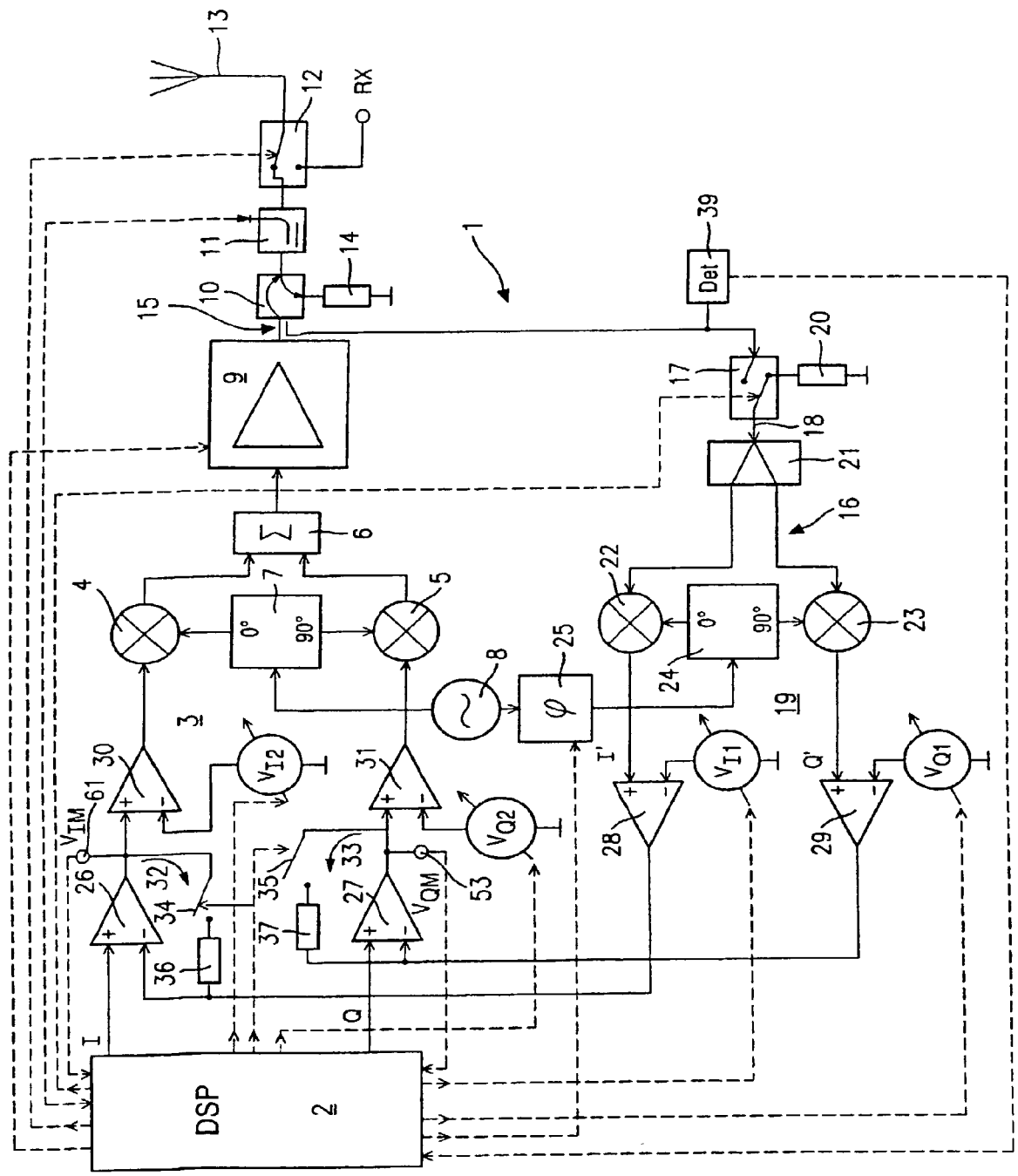
FIG. 1 is a block diagram depicting an example of one embodiment of the transmitter proposed by the invention.

FIG. 1 is a block diagram illustrating the operating principle of an example of a first embodiment of the transmitter proposed by the invention.

A digital signal processor (DSP) 2 generates a complex input signal for a quadrature modulator 3, which consists of an in-phase mixer 4, a quadrature-phase mixer 5 and a summer 6 as well as a phase shifter 7. The complex input signal consists of an in-phase component I and a quadrature-phase component Q, the in-phase component I being forwarded to the in-phase mixer 4 and the quadrature-phase component Q to the quadrature-phase mixer 5. The output signal of a local oscillator 8 is applied to the phase shifter 7 and the phase shifter 7 forwards this oscillator signal to the in-phase mixer 4 without any phase shift and to the quadrature-phase mixer 5 with a phase shift of 90°.

Connected downstream of the quadrature modulator 3 is a power amplifier 9, which amplifies the power of the quadrature modulated signal to the transmission power of the transmitter 1 and forwards it via a circulator 10, a power detector 11 and a transmit-receive switch 12 to an antenna 13. In the embodiment illustrated as an example in FIG. 1, the digital signal processor 2 simultaneously serves as a control unit for switching from transmission to reception mode and controls the transmit-receive switch 12 so that the antenna is connected to the power amplifier 9 in transmission mode and to a receiver denoted by RX in reception mode. The circulator 10 connected to the terminating resistor 14 is used to prevent feedback of any reflected transmission power into the power amplifier 9.

Located in the signal path between the power amplifier 9 and the antenna 13 is an output coupler 15 which couples the output signal of the power amplifier 9 into a feedback loop 16. Located in the feedback loop 16 is a selector switch 17, by means of which an input 18 of a quadrature demodulator 19 can be selectively connected to the output coupler 15 or a terminating resistor 20. A logarithmic power detector 39 is disposed between the output coupler 15 and the selector switch 17. The quadrature demodulator 19 consists of a signal splitter 21, which splits the input signal evenly between an in-phase mixer 22 and a quadrature-phase mixer 23. A phase shifter 24 is also provided, to which the output signal of the local oscillator 8 is forwarded via an adjustable phase shifter 25. The phase shifter 24 operates in the same way as the phase shifter 7 and forwards a non-phase-shifted oscillator signal to the in-phase mixer 22 and an oscillator signal phase-shifted by 90° to the quadrature-phase mixer 23, the oscillator signal having been previously phase-shifted overall by a phase angle φ by a phase shifter 25.

A feedback in-phase component I' is generated at the output of the in-phase mixer 22 and a feedback quadrature-phase component Q' at the output of the quadrature-phase mixer 23. The in-phase component I of the input signal is sent to the (+) input of a first differential amplifier 26 whilst the feedback in-phase component I' is sent to the (−) input of the first differential amplifier 26. In the same way, the quadrature-phase component Q of the input signal is applied to the (+) input of a second differential amplifier 27 whilst the feedback quadrature phase component Q' is applied to the (−) input of the second differential amplifier 27. As a result of this feedback arrangement, generally referred to as a Cartesian feedback, linearisation errors of the power amplifier 9 are compensated by the quadrature demodulator 19 and the differential amplifiers 26 and 27 disposed in the feedback loop 16. However, care should be taken to ensure that the feedback signal I', Q' is forwarded to the differential amplifiers 26 and 27 with a phase shift of 0° relative to the input signal I, Q. The correct phase position is adjusted by the adjustable phase shifter 25, whose phase angle φ can be varied via the digital signal processor by means of a control signal.

Since both the quadrature modulator 3 and the quadrature demodulator 19 have a DC offset, this DC offset needs to be compensated accordingly.

A third differential amplifier 28 is used for this purpose, disposed between the in-phase mixer 22 of the quadrature demodulator 19 and the first amplifier 26. A fourth differential amplifier 29 is provided between the quadrature-phase mixer 23 of the quadrature demodulator 19 and the second differential amplifier 27. Whilst the feedback in-phase component I' is forwarded to the (+) input of the third differential amplifier 28, a first compensating voltage $V_{I1}$, is applied to the (−) input of the third differential amplifier 28 so that the DC offset of the I' component of the quadrature demodulator 19 is compensated at the output of the third differential amplifier 28. Similarly, the feedback quadrature-phase component Q' is applied to the (+) input of the fourth differential amplifier 29 whilst a fourth compensating voltage $V_{Q1}$ is forwarded to its (−) input.

A fifth differential amplifier 30 is used to compensate the DC offset of the quadrature modulator 3, the (+) input of which is forwarded to the output of the first differential amplifier 26 whilst a third compensating voltage $V_{I2}$ is applied to its (−) input. A sixth differential amplifier 31 is also provided, the output of which is connected to the quadrature-phase mixer 5 of the quadrature modulator 3 and the (+) input of which is applied to the output of the second differential amplifier 27. A fourth compensating voltage $V_{Q2}$ is applied to the (−) input of the sixth differential amplifier 31. The compensating voltages $V_{I1}$, $V_{Q1}$, $V_{I2}$ and $V_{Q2}$ are shown as controllable voltage sources in FIG. 1 for the sake of clarity in the drawing but in practice, these compensating voltages may be internally generated in the digital signal processor 2.

Switching rapidly between transmission mode and reception mode using a feedback loop 16 operated on the Cartesian feedback principle causes a problem in that the high-frequency signal path of the loop, consisting of the quadrature modulator 3, the power amplifier 9, the quadrature demodulator 19 and the differential amplifiers 26 and 27, has to be interrupted when the switch is made from transmission mode to reception mode because the power amplifier 9 and the local oscillator 8 have to be disabled. When the power amplifier 9 and the local oscillator 8 are re-activated and the high-frequency signal path restored via the feedback loop 16, a switching surge is produced because the voltages of the control system, in other words the output voltages of the two differential amplifiers 26, 27, act in the positive or negative control sense when the high-frequency signal path is open. This leads to an unacceptable jump in power to the maximum possible transmission power of the power amplifier 9. If, as is the case in applications using VDL digital aeronautical radio (VHF digital link), only a short switching time is available, the Cartesian feedback system cannot be used without taking specific measures. In a TDMA system (such as VDL, for example), the power of the adjacent channel must not be adversely affected by burst mode operation. The definition of the VDL standard theoretically permits the transmitter to be enabled and disabled free of interference. The feature proposed by the invention guarantees an ideal interference-free spectrum in the sampled range.

In order to get round this problem, the invention proposes that, in addition to the high-frequency signal path from the output of the differential amplifiers 26 and 27 to the (−) input of the differential amplifiers 26 and 27 via the quadrature modulator 3, the power amplifier 9 and the quadrature demodulator 19, two direct DC signal paths 32 and 33 be provided, which connect the output of the respective associated differential amplifier 26 or 27 directly to the (−) input of the respective differential amplifier 26 or 27. In the embodiment illustrated as an example here, the direct DC signal paths 32 and 33 consist respectively of a controllable switch 34 or 35, which may be provided in the form of field effect transistors, for example, and a resistor 36 or 37 connected in series.

The switch from transmission mode to reception mode as proposed by the invention is made in such a way that before the high-frequency signal path is opened, the switches 34 and 35 are firstly closed so that both the high-frequency signal path via the feedback loop 16 and the direct DC signal paths 32 and 33 are operating. Then, the switch 17 is activated by the digital signal processor 2 so that the input 18 of the quadrature demodulator 19 is no longer connected to the output coupler 15 but to the terminating resistor 20, which means that the high-frequency signal path via the feedback loop 16 is broken. Since there is therefore no longer any input signal at the input of the quadrature demodulator 19, the level at the (−) input of the first and second differential amplifiers 26 and 27 is defined by the feedback of the DC signal path 32 or 33 and the constant output voltage of the third and fourth differential amplifiers 28 and 29. Even before the high-frequency signal path is opened by reversing the switch 17, the current supply (bias) of the power amplifier 9 can be shut off. The transmit-receive switch 12 at the input of the antenna 13 can already be switched, once the I/Q input signal has been reduced (ramping), before the switches 34, 35 and 17 are activated and before the current supply of the power amplifier 9 is broken, as a result of which a good breaking isolation is immediately obtained. Reflections occurring at the transmit-receive switch 12 are forwarded via the circulator 10 to the terminating resistor 14. Finally, the local oscillator 8 is switched off.

When switching to transmission mode, the sequence is operated in reverse order.

Firstly the local oscillator 8 is enabled and the current supply (bias) connected to the power amplifier 9. The high-frequency signal path via the feedback loop 16 is then closed by switching the selector switch 17. The switches 34 and 35 are then opened so that the DC signal paths 32 and 33 are broken again. The transmit-receive switch 12 is switched so that the output of the power amplifier 9 is connected to the antenna 13.

The system of overlapping switching between DC signal path and high-frequency signal path as proposed by the invention ensures that no signal jumps occur during switching because the output of the first and second differential amplifier 26 or 27 is constantly connected to its (−) input either via the high-frequency signal path or via the DC signal path 32 or 33. Consequently, there is always a defined signal level at the (−) input of the differential amplifiers 26 and 27.

Figure 2:
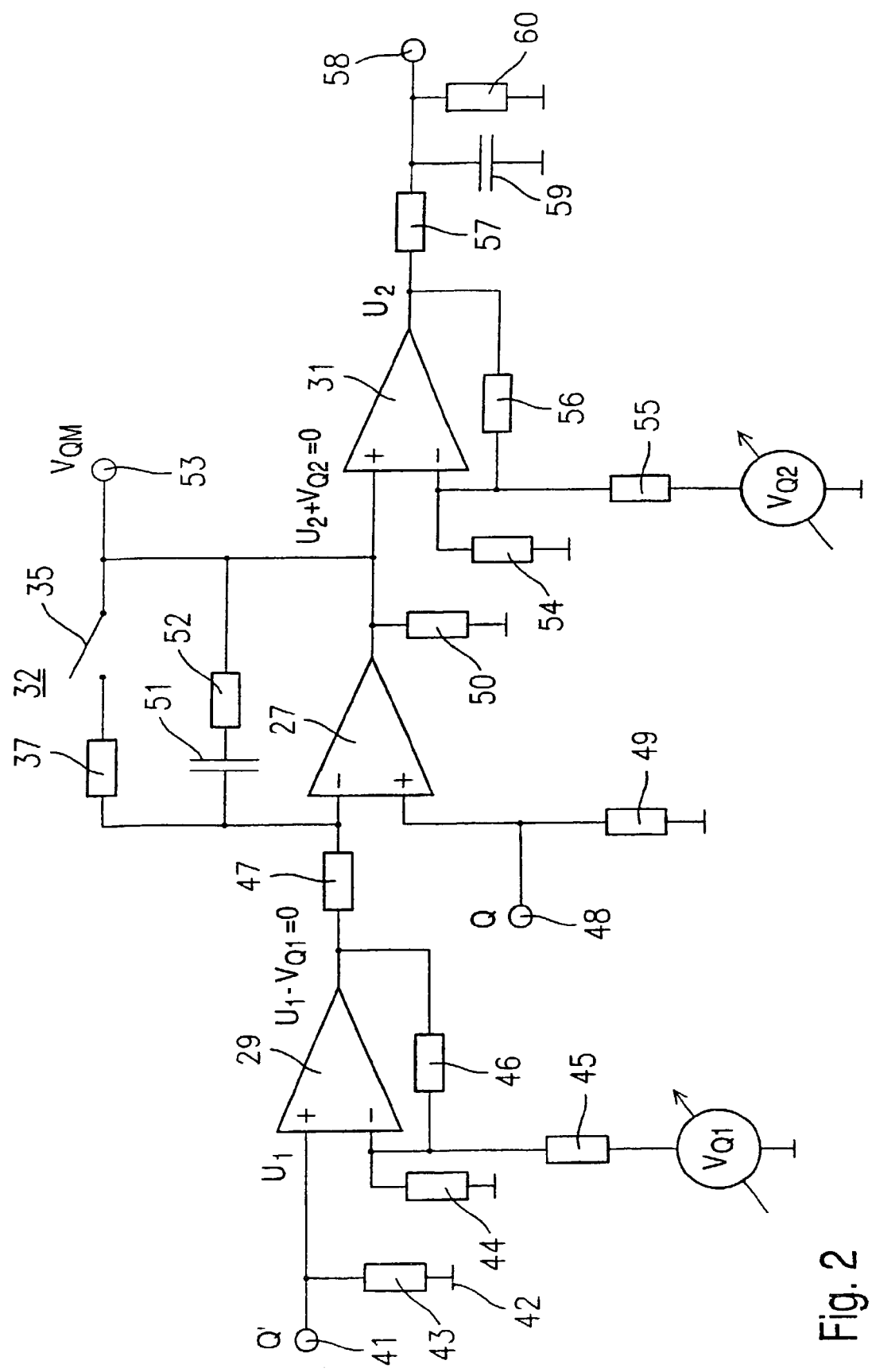
FIG. 2 is a detail from the transmitter illustrated in FIG. 1.

FIG. 2 is a more detailed circuit diagram illustrating the connections of the differential amplifiers 26, 27, 28, 29, 30 and 31, only the signal path for the quadrature-phase component Q, in other words the differential amplifiers 29, 27 and 31, being shown. An identical circuit is provided for the in-phase component I.

The input terminal 41 is connected to the output of the quadrature-phase mixer 23 of the quadrature demodulator 19 and internally with the (+) input of the differential amplifier 29. Between the (+) input of the differential amplifier 29 and the circuit earth 42 is a resistor 43. Another resistor 44 is disposed between the (−) input of the differential amplifier 29 and the circuit earth 42, the compensating voltage $V_{Q1}$ being forwarded to the (−) input of the differential amplifier 29 via a series resistor 45. Between the output of the differential amplifier 29 and its (−) input is another resistor 46. The output of the differential amplifier 29 is connected to the (−) input of the differential amplifier 27 via a series resistor 47.

The quadrature-phase component Q of the complex input signal is applied to the (+) input of the differential amplifier 27 via a terminal 48. Between the terminal 48 and the circuit earth 42 is another resistor 49. A further resistor 50 is provided between the output of the differential amplifier 27 and the circuit earth 42. Between the output of the differential amplifier 27 and the (−) input of the differential amplifier 27 is a serially-connected RC-element, consisting of the capacitor 51 and the series resistor 52. Connected in parallel therewith is the DC signal path 33, which consists of the controllable switch 35 and the series resistor 37. Consequently, by closing the controllable switch 35, a potential equalisation is produced between the output of the differential amplifier 27 and its (−) input. The measurement voltage $V_{QM}$ lies on the output of the differential amplifier 27 at the measuring point 53, the importance of which will be explained in more detail below.

The wiring of the differential amplifier 31 is identical to the wiring of the differential amplifier 29 and the layout of the resistors 54–57 corresponds to the layout of the resistors 44–47. The correction value for the quadrature-phase mixer 5 of the quadrature modulator 3 can be taken from the output terminal 58. A RC-element consisting of the capacitor 59 and the resistor 60 connected in parallel therewith is disposed at the output terminal 58. The RC-element defines the bandwidth of the high-frequency signal path.

The potential at the (+) input of the differential amplifier 29 is $U_1$, whilst the potential at the output of the differential amplifier 29 or at the (−) input of the differential amplifier 27 is $U_1-V_{Q1}$. Similarly, the potential at the output of the differential amplifier 27 or at the (+) input of the differential amplifier 31 is $U_2+V_{Q2}$, which means that a potential of $U_2$ is set at the output of the differential amplifier 31. The variable compensating voltages $V_{Q1}$ and $V_{Q2}$ are set by an interactive compensating process so that the potential at the (−) input and at the output of the differential amplifier 27 is respectively zero, i.e. $U_1-V_{Q1}=0$ and $U_2+V_{Q2}=0$. Since the potential at the (−) input and output of the differential amplifier 27 is uniformly zero, there are no switching surges when the switch 35 is operated and the DC signal path 32 can be switched on and off surge-free.

FIG. 3 illustrates the method proposed by the invention as a means of switching between the transmission mode and a transmission-interrupt mode or reception mode. A compensating process proposed by the invention which may advantageously be used within the context of the invention will simultaneously be explained with reference to this schematic timing diagram. FIG. 3 gives a logarithmic presentation of the output power P of the power amplifier 9 as a function of time t.

The VDL standard prescribes that at the start of the transmission period, a start signal should firstly be transmitted for a period of 3 data symbols, the complex input signal exclusively having an in-phase component I but no quadrature-phase component Q. Within this time period, denoted by 71, the phase angle φ for the phase shifter 25 can therefore be measured. Since only an in-phase component I is transmitted during period 71, the voltage at the measuring point 53 would have to be zero. The phase angle φ can therefore be selectively modified before the next transmission period (burst) so that the measurement voltage at the measuring point 53 is optimised to a smallest possible value. This phase angle φ is then maintained until the next transmission period and can be further optimised in the subsequent transmission period.

Data are transmitted between the instants $t_2$ and $t_3$. At instant $t_3$, the actual transmission process is terminated. In accordance with the VDL standard, situations arise in which a rapid switch has to be made between transmission mode and reception mode within a few 100 μs. This is indicated by line 75 in FIG. 3. In this case, the procedure is as described above: the transmit-receive switch 12 is switched and the DC signal paths 32 and 33 are firstly established by closing the switches 34 and 35. The current supply (bias) of the power amplifier 9 is then switched off and the input 18 of the quadrature demodulator 19 switched from the output coupler 15 to the terminating resistor 20. Finally, the local oscillator 8 is disabled.

In VDL operation, however, there are also situations which permit a slower switching between transmission mode and reception mode, where there are approximately 2.5 ms within which to effect automatic compensation. This automatic compensation process is described below.

The quadrature demodulator 19 is trimmed during the period 72 as part of an optional trimming process. This trimming may also be dispensed with if necessary. To this end, the input signal I/Q is firstly reduced to zero so that the power amplifier generates only a minimal residual power P2. The compensating voltages $V_{I1}$, and $V_{Q1}$, which compensate the DC offset of the quadrature demodulator 19, are optimised so that a minimal residual power $P_2$ is detected at the logarithmic power detector 39. Since there is no input signal I/Q, the ideal output power $P_2$ is zero and an existing output signal will essentially be determined from the DC offset of the quadrature demodulator 19.

In the subsequent period 73, the quadrature modulator 3 is adjusted in that the measurement voltage $V_{IM}$ of the in-phase component is measured at the measuring point 61 and the measurement voltage $V_{QM}$ of the quadrature-phase component at the measuring point 53 in FIG. 1. Again with this measurement, both the in-phase component I and the quadrature-phase component Q of the input signal generated by the digital signal processor 2 are zero so that the measured voltage $V_{QM}$ is essentially derived from the DC offset of the quadrature modulator 3. By adjusting the voltages $V_{I2}$ and $V_{Q2}$, the measurement voltages $V_{IM}$ and $V_{QM}$ are minimised towards zero. As a result, the DC offset of the modulator 3 is compensated.

The measurement is taken during period 72 and 73 during which the high-frequency signal path still closed, i.e. the switches 34 and 35 are still open and the selector switch 17 connects the input 18 of the quadrature demodulator 19 to the output coupler 15. Furthermore, the voltage supply (bias) for the power amplifier 9 is still connected.

At instant $t_4$, the two switches 34 and 35 are firstly closed, after which the selector switch 17 is switched to the terminating resistor 20 so that the DC signal paths 32 and 33 are now active but not the high-frequency signal path. Before the selector switch 17 is operated, the current supply to the power amplifier 9 is switched off.

Since the input signal at the quadrature demodulator 19 is zero as a result and because the digital signal processor 2 continues to generate an input signal I,Q of zero, a measurement voltage $V_{IM}$ and $V_{QM}$ measured at the measuring points 53 and 61 is essentially generated as a result of the DC offset of the quadrature demodulator 19. By shifting the compensating voltages $V_{I1}$, and $V_{Q1}$ in the period 74, this DC offset and hence the measurement voltage $V_{IM}$ or $V_{QM}$ can be minimised. The values of the compensating voltages $V_{I1}$, $V_{Q1}$, $V_{I2}$, $V_{Q2}$ found as a result of this compensating procedure can be used for the next transmission period.

At instant $t_5$, the level of the local oscillator 8 is additionally reduced in order to prevent radiation in the receiver. This further enhances isolation between the transmitter and the receiver.

The invention is not restricted to the embodiments illustrated as examples here. In particular, the compensating steps may also be run in a different sequence or individual compensating steps dispensed with.

What is claimed is:

1. A transmitter comprising:
    a quadrature modulator for quadrature modulating an in-phase component and a quadrature-phase component of a complex input signal;
    a power amplifier connected downstream of the quadrature modulator;
    a quadrature demodulator for quadrature demodulating the output signal of the power amplifier into a feedback in-phase component and a feedback quadrature-phase component;
    a first differential amplifier connected upstream of the quadrature modulator, said first differential amplifier having a first input to which the in-phase component of the input signal is applied and a second input to which the feedback in-phase component is applied; and
    a second differential amplifier connected upstream of the quadrature modulator, said second differential amplifier having a first input of the second differential amplifier to which the quadrature-phase component of the input signal is applied and a second input of the second differential amplifier to which the feedback quadrature-phase component is applied,
    wherein an output of the first differential amplifier is directly connectable to the second input of the first differential amplifier via a first direct DC signal path, bypassing the quadrature modulator, the power amplifier and the quadrature demodulator, when switching from a transmission mode into a transmission-interrupt mode, and wherein an output of the second differential amplifier is directly connectable to the second input of the second differential amplifier via a second direct DC signal path, bypassing the quadrature modulator, the power amplifier and the quadrature demodulator, when switching from the transmission mode into the transmission-interrupt mode.

2. The transmitter as claimed in claim 1, wherein each direct DC signal path has a respective first controllable switch.

3. The transmitter as claimed in claim 2, further comprising a second controllable switch adapted to interrupt the feedback in-phase component and the feedback quadrature-phase component of the output signal.

4. The transmitter as claimed in claim 3, wherein the second controllable switch is disposed at an input of the quadrature demodulator and deactivates the input of the quadrature demodulator via a defined input resistance in response to a signal interruption.

5. The transmitter as claimed in claim 4, wherein a DC offset of the in-phase component of the quadrature demodulator can be compensated by a first compensating voltage and a DC offset of the quadrature-phase component of the quadrature demodulator can be compensated by a second compensating voltage.

6. The transmitter as claimed in claim 5, wherein a third differential amplifier is connected upstream of the first differential amplifier, the first compensating voltage being connected to the third differential amplifier, and a fourth differential amplifier is connected upstream of the second differential amplifier, the second compensating voltage being connected to the fourth differential amplifier.

7. The transmitter as claimed in claim 6, wherein a DC offset of the in-phase component of the quadrature modulator can be compensated by way of a third compensating voltage and a DC offset of the quadrature-phase component of the quadrature modulator can be compensated by way of a fourth compensating voltage.

8. The transmitter as claimed in claim 7, wherein a fifth differential amplifier is connected downstream of the first differential amplifier, the fifth differential being connected to the third compensating voltage, and a sixth differential amplifier is connected downstream of the second differential amplifier, the sixth differential amplifier being connected to the fourth compensating voltage.

9. The transmitter as claimed in claim 5, wherein a DC offset of the in-phase component of the quadrature modulator can be compensated by way of a third compensating voltage and a DC offset of the quadrature-phase component of the quadrature modulator can be compensated by way of a fourth compensating voltage.

10. The transmitter as claimed in claim 9, wherein a fifth differential amplifier is connected downstream of the first differential amplifier, the fifth differential being connected to the third compensating voltage, and a sixth differential amplifier is connected downstream of the second differential amplifier, the sixth differential amplifier being connected to the fourth compensating voltage.

11. A method for switching the transmitter of claim 1 from a transmission mode into a transmission-interrupt mode, said method comprising:
providing the transmitter of claim 1;
activating the first direct DC signal path between the output of the first differential amplifier and the second input of the first differential amplifier;
activating the second direct DC signal path between the output of the second differential amplifier and the second input of the second differential amplifier; and
opening a high-frequency signal path running from the outputs of the first and second differential amplifiers via the quadrature modulator, the power amplifier and the quadrature demodulator to the second inputs of the first and second differential amplifiers,
wherein the activating steps precede the opening step.

12. The method as claimed in claim 11, wherein the high-frequency signal path is opened upstream of the input of the quadrature demodulator, and the method further comprises:
deactivating a voltage supply for the power amplifier; and
closing the input of the quadrature demodulator with a defined input resistance.

13. The method as claimed in claim 12, wherein prior to activating the first and second direct DC signal paths and prior to opening the high-frequency signal path, the quadrature modulator is compensated so that the output voltages of the first and second differential amplifiers are minimized.

14. The method as claimed in claim 13, wherein after activating the first and second DC signal paths and after opening the high-frequency signal path, the quadrature demodulator is compensated so that the output voltages of the first and second differential amplifiers are minimized.

15. The method as claimed in claim 12, wherein after activating the first and second DC signal paths and after opening the high-frequency signal path, the quadrature demodulator is compensated so that the output voltages of the first and second differential amplifiers are minimized.

16. The method as claimed in claim 12, wherein before activating the first and second direct DC signal paths and before opening the high-frequency signal path, the quadrature demodulator is compensated so that the output power of the power amplifier is minimized when the input signal of the transmitter interrupted.

17. The method as claimed in claim 11, wherein prior to activating the first and second direct DC signal paths and prior to opening the high-frequency signal path, the quadrature modulator is compensated so that the output voltages of the first and second differential amplifiers are minimized.

18. The method as claimed in claim 17, wherein after activating the first and second DC signal paths and after opening the high-frequency signal path, the quadrature demodulator is compensated so that the output voltages of the first and second differential amplifiers are minimized.

19. The method as claimed in claim 17, wherein before activating the first and second direct DC signal paths and before opening the high-frequency signal path, the quadrature demodulator is compensated so that the output power of the power amplifier is minimized when the input signal of the transmitter is interrupted.

20. The method as claimed in claim 11, wherein after activating the first and second DC signal paths and after opening the high-frequency signal path, the quadrature demodulator is compensated so that the output voltages of the first and second differential amplifiers are minimized.

21. The method as claimed in claim 20, wherein before activating the first and second direct DC signal paths and before opening the high-frequency signal path, the quadrature demodulator is compensated so that the output power of the power amplifier is minimized when the input signal of the transmitter is interrupted.

22. The method as claimed in claim 11, wherein before activating the first and second direct DC signal paths and before opening the high-frequency signal path, the quadrature demodulator is compensated so that the output power of the power amplifier is minimized when the input signal of the transmitter is interrupted.

* * * * *